United States Patent
Chan et al.

(10) Patent No.: US 10,033,335 B1
(45) Date of Patent: Jul. 24, 2018

(54) DOHERTY POWER AMPLIFIER

(71) Applicant: City University of Hong Kong, Kowloon (HK)

(72) Inventors: Wing Shing Chan, Kowloon (HK); Xin Yu Zhou, Kowloon (HK); Shao Yong Zheng, Guangzhou (HK); Shi Chang Chen, Hangzhou (HK); Derek Ho, Diamond Hill (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 15/588,796

(22) Filed: May 8, 2017

(51) Int. Cl.
| | |
|---|---|
| *H03F 3/68* | (2006.01) |
| *H03F 1/02* | (2006.01) |
| *H03F 3/193* | (2006.01) |
| *H03F 3/21* | (2006.01) |
| *H03F 1/56* | (2006.01) |

(52) U.S. Cl.
CPC ............ *H03F 1/0288* (2013.01); *H03F 1/56* (2013.01); *H03F 3/193* (2013.01); *H03F 3/21* (2013.01); *H03F 2200/222* (2013.01); *H03F 2200/387* (2013.01); *H03F 2200/451* (2013.01)

(58) Field of Classification Search
CPC . H03F 3/68; H03F 3/191; H03F 3/193; H03F 1/0288
USPC ...................................... 330/124 R, 295, 302
See application file for complete search history.

(56) References Cited

U.S. PATENT DOCUMENTS

| | | | |
|---|---|---|---|
| 9,209,511 B2 | 12/2015 | Mei | |
| 9,236,190 B2 | 1/2016 | Schenk | |
| 9,374,041 B2 | 6/2016 | Liu | |
| 9,444,420 B2 | 9/2016 | Dalisda et al. | |
| 9,450,543 B2 | 9/2016 | Yang et al. | |
| 9,467,115 B2 | 10/2016 | Lyalin | |
| 9,496,837 B2 | 11/2016 | Qureshi | |
| 9,509,252 B2 | 11/2016 | Moronval et al. | |
| 9,531,325 B2 | 12/2016 | Yu et al. | |
| 9,537,198 B2 | 1/2017 | Seneviratne et al. | |
| 2015/0091651 A1* | 4/2015 | Seneviratne | H03F 1/42 330/295 |

* cited by examiner

*Primary Examiner* — Steven J Mottola
(74) *Attorney, Agent, or Firm* — Renner Kenner Greive Bobak Taylor & Weber

(57) ABSTRACT

A Doherty power amplifier includes a main device in a main amplifier circuit and an auxiliary device in an auxiliary amplifier circuit arranged in parallel with the main amplifier circuit. The Doherty power amplifier further includes a load modulation network including a first open-circuited transmission line connected to an output of the main device; a second open-circuited transmission line connected to an output of the auxiliary device; and an impedance transformation and phase compensation network connected with the output of the main device and the output of the auxiliary device for providing a combined output power. The first and second open-circuited transmission lines are arranged directly adjacent one another to form, during operation, a mutual coupling therebetween.

20 Claims, 12 Drawing Sheets

DOHERTY POWER AMPLIFIER

TECHNICAL FIELD

The present invention relates to a Doherty power amplifier, and particularly, although not exclusively, to a Doherty power amplifier of modified configuration for improved bandwidth and efficiency.

BACKGROUND

In the past, the modulation formats used in mobile communication systems were limited by the radio frequency (RF) power amplifier efficiency. However, with the advances in transistor technology and amplifier topology, this limitation has been overcome and modulation formats with high efficiencies have now become the norm.

The Doherty power amplifier (DPA) is widely adopted in modern third generation (3G) and fourth generation (4G) wireless communication systems, primarily because it offers additional efficiency peak at back-off. This additional efficiency peak allows higher amplifier efficiencies at output back-off region, and as a result, a significant reduction in power consumption can be achieved (as these amplifiers are one of the main power consumers in these systems).

To date, the bandwidth remains a limiting factor for DPAs.

SUMMARY OF THE INVENTION

In accordance with a first aspect of the present invention, there is provided a Doherty power amplifier, comprising: a main device in a main amplifier circuit; an auxiliary device in an auxiliary amplifier circuit arranged in parallel with the main amplifier circuit; a load modulation network, comprising: a first open-circuited transmission line connected with an output of the main device; a second open-circuited transmission line connected with an output of the auxiliary device; and an impedance transformation and phase compensation network connected with the output of the main device and the output of the auxiliary device for providing a combined output power; wherein the first and second open-circuited transmission lines are arranged directly adjacent one another to form, during operation, a mutual coupling therebetween.

In one embodiment of the first aspect, the mutual coupling comprises an electric coupling. The electric coupling is formed preferably over both the low power region and the Doherty region.

In one embodiment of the first aspect, the mutual coupling comprises or further comprises a magnetic coupling when the Doherty power amplifier is operating in low power region. The magnetic coupling is formed preferably only when the Doherty power amplifier is operating in low power region (i.e., not formed at the Doherty region).

In one embodiment of the first aspect, the first and second open-circuited transmission lines each forming a respective second harmonic short-circuited network, the two second harmonic short-circuited networks being mutually coupled during operation.

In one embodiment of the first aspect, the first open-circuited transmission line is stepped with a first portion and a second portion narrower than the first portion. A central axis of the second portion may be offset from a central axis of the first portion. Preferably, the second portion is arranged at an open end.

In one embodiment of the first aspect, the second open-circuited transmission line is stepped with a first portion and a second portion narrower than the first portion. A central axis of the second portion may be offset from a central axis of the first portion. Preferably, the second portion is arranged at an open end.

In one embodiment of the first aspect, the first and second open-circuited transmission lines have complementary shapes.

In one embodiment of the first aspect, the first open-circuited transmission line is stepped with a first portion and a second portion narrower than the first portion; the second open-circuited transmission line is stepped with a first portion and a second portion narrower than the first portion; and wherein at least the second portion of the first open-circuited transmission line and the second portion of the second open-circuited transmission line are arranged directly adjacent each other.

In one embodiment of the first aspect, the impedance transformation and phase compensation network comprises: a first impedance inverter connected at the output of the main device; a second impedance inverter connected at the output of the auxiliary device; and a phase compensation network connected with the first and second impedance inverters to provide the combined output power.

In one embodiment of the first aspect, the Doherty power amplifier further comprises a splitter circuit arranged to receive an RF signal and split the RF signal into at least a signal to be transmitted to the main power amplifier circuit and a signal to be transmitted to the auxiliary power amplifier circuit. The splitter circuit is preferably a power splitter circuit.

In one embodiment of the first aspect, the main amplifier circuit further includes: an input matching network; a stabilization network; and a bias network arranged to bias one or both of drain and gate of the main device.

In one embodiment of the first aspect, the auxiliary amplifier circuit further includes: an input matching network; a stabilization network; and a bias network arranged to bias one or both of drain and gate of the auxiliary device.

In one embodiment of the first aspect, the Doherty power amplifier further comprises a post-matching network connected with the load modulation network to maximally transfer the combined output power. The post-matching network is preferably a high order low pass matching network.

In one embodiment of the first aspect, the main device is a carrier device biased to operate in Class-AB mode. In other embodiments, the carrier device may be arranged to operate in other modes, such as Class-J, Class-F, or Class-E. The carrier device may be or may include a transistor.

In one embodiment of the first aspect, the auxiliary device is a peaking device biased to operate in Class-C mode. In other embodiments, the auxiliary device may be arranged to operate in other modes, such as Class-F, Class-$F^{-1}$, or Class-E. The auxiliary device may be or may include a transistor.

In one embodiment of the first aspect, the Doherty power amplifier comprises one or more auxiliary devices arranged in a respective auxiliary amplifier circuits.

In accordance with a second aspect of the present invention, there is provided an electronic device incorporating the Doherty power amplifier of the first aspect. Preferably, the electronic device is an active electronic device.

BRIEF DESCRIPTION OF THE DRAWINGS

Embodiments of the present invention will now be described, by way of example, with reference to the accompanying drawings in which:

FIG. 5a is a block diagram showing an output arrangement of a Doherty power amplifier;

FIG. 5b is block diagram equivalent that of FIG. 5a;

FIG. 6a is a block diagram showing an output arrangement of a Doherty power amplifier in accordance with one embodiment of the present invention;

FIG. 6b is block diagram equivalent that of FIG. 6a;

FIG. 8b is an enlarged view of the load modulation network in FIG. 8a;

FIG. 9 is a graph showing simulated and measured small signal performance of the Doherty power amplifier in FIG. 8a;

DETAILED DESCRIPTION OF THE PREFERRED EMBODIMENT

Figure 1:
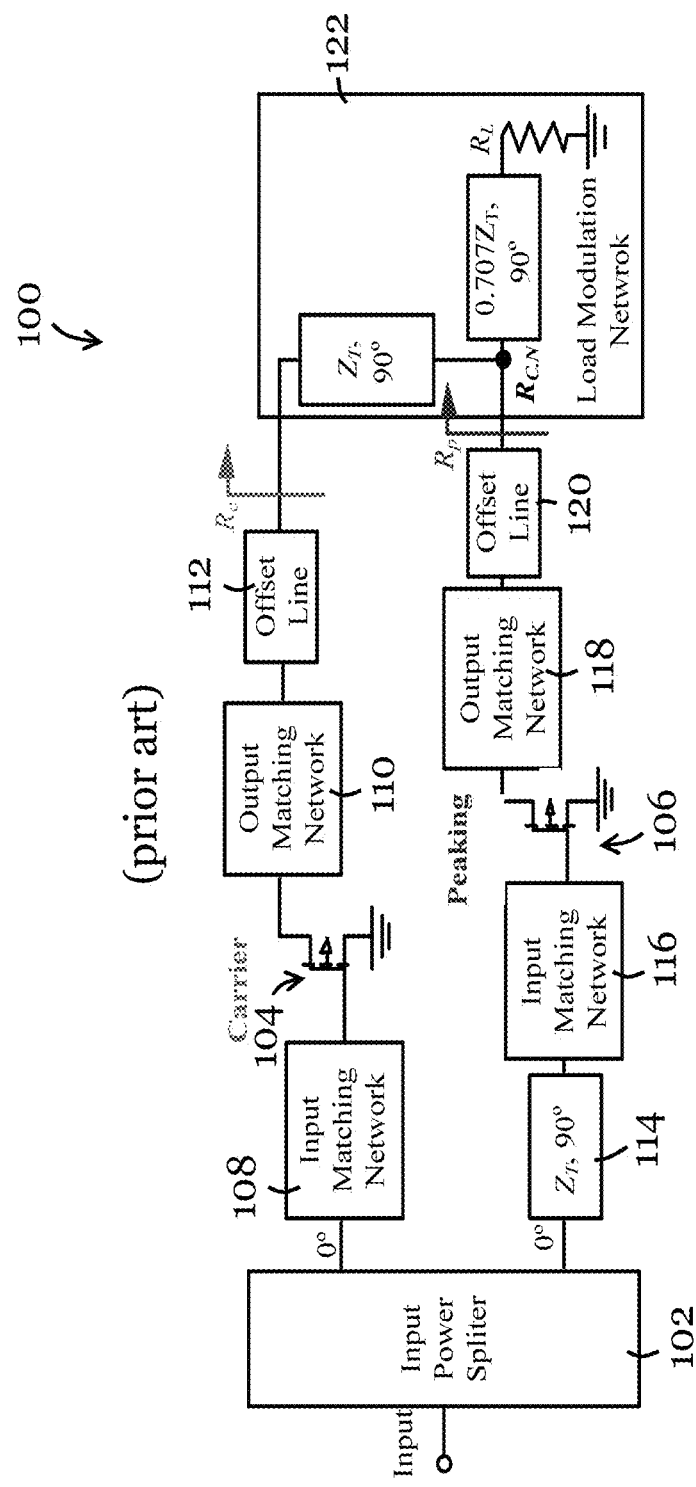
FIG. 1 is a block diagram of a conventional Doherty power amplifier.

FIG. 1 shows a block diagram of a conventional Doherty power amplifier 100. As shown in FIG. 1, the amplifier 100 includes an input power splitter 102 arranged at an input. The input power splitter 102 is connected, at the output, with two circuit branches, one associated with a carrier (main) amplifier circuit having a carrier (main) device 104 in the form of a transistor and another one associated with a peaking (auxiliary) amplifier circuit having a peaking (auxiliary) device 104 in the form of a transistor. In the carrier amplifier circuit branch, an input matching network 108 is arranged between the input power splitter 102 and the carrier device 104. An output matching network 110 and an offset line 112 are arranged at the output of the carrier device 104. In the peaking amplifier circuit branch, a quarter wavelength transmission line 114 and an input matching network 116 are arranged between the input power splitter 102 and the peaking device 106. An output matching network 118 and an offset line 120 are connected at the output of the peaking device 106. A load modulation network formed by impedance transformers/transmission lines is arranged at the output of the two branches.

In the conventional arrangement in FIG. 1, the carrier device 104 is biased to operate in class-AB mode and the peaking device 106 is biased to operate in class-C mode. In operation, the load impedance of the carrier device 104 is modulated by the peaking device 106 output current through the load modulation network 122 at the Doherty region. This results in an additional efficiency peak which appears in the back-off region. However, the presence of device output capacitance and a high impedance transformation ratio of the quarter-wavelength impedance inverter mean that high back-off efficiency cannot be maintained over a wide range of operating frequencies.

Figure 2:
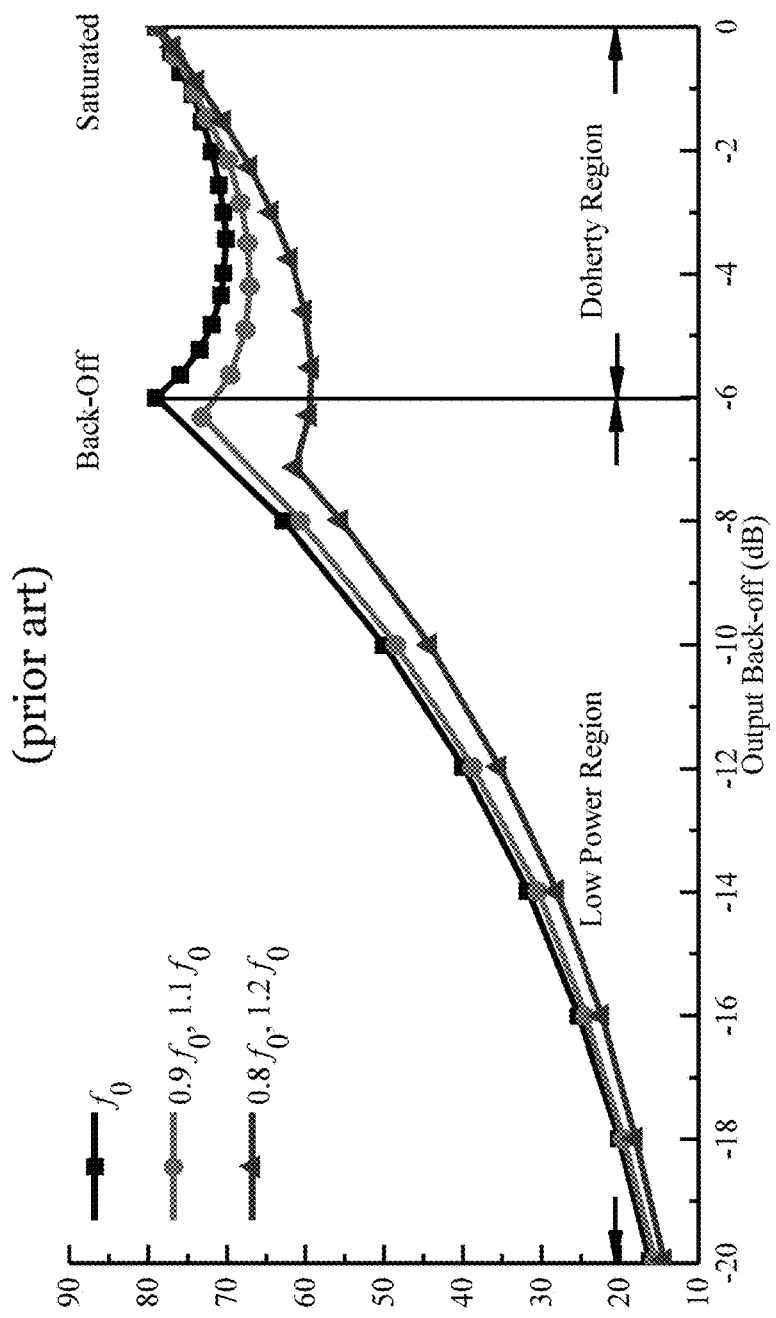
FIG. 2 is a graph showing drain efficiencies against output back-off value at different normalized frequencies for a conventional Doherty power amplifier.

FIG. 2 is a graph showing drain efficiencies of a conventional Doherty power amplifier for different output back-off value at different normalized frequencies (0.8 $f_o$, 0.9 $f_o$, $f_o$, 1.1 $f_o$, 1.2 $f_o$). As shown, the drain efficiencies for $f_o$ (and its multiples) generally increases with the output back-off in the lower power region, then drops near or in the Doherty region, and peaks again at the saturated point. However, the drain efficiency at back-off point decreases significantly with the shift of frequency.

Figure 3:
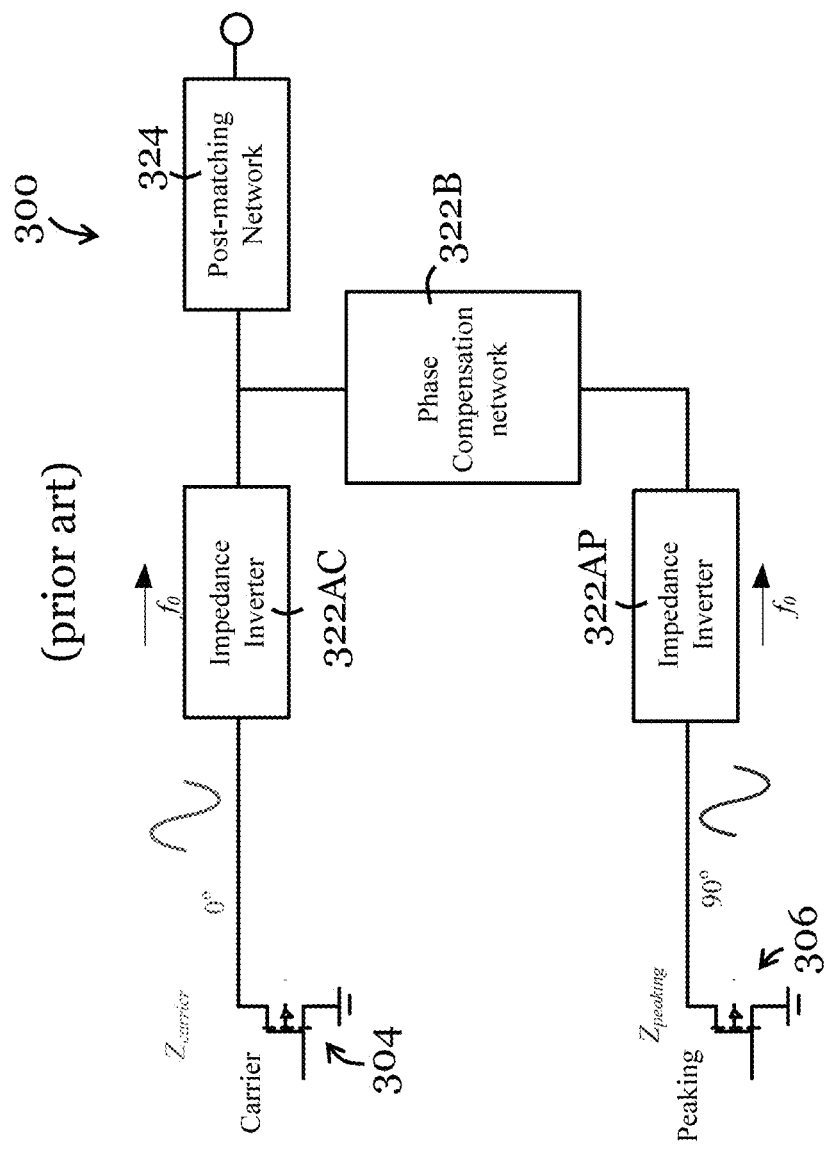
FIG. 3 is a block diagram showing an output arrangement of a Doherty power amplifier.

The inventors of the present invention have devised, through research, experiments and trials, that the output arrangement 300 of a Doherty power amplifier shown in FIG. 3 may address the above issue, but at the expense of back-off efficiency. In FIG. 3, the output arrangement 300 comprises an impedance inverter 322AC connected with the output of carrier device 304 in the carrier amplifier circuit branch, an impedance inverter 322AP connected with the output of peaking device 306 in the peaking amplifier circuit branch, a phase compensation network 322B connected between the two impedance inverters 322AC, 322AP, and a post-matching network 324 downstream of the phase compensation network 322B.

Figure 4:
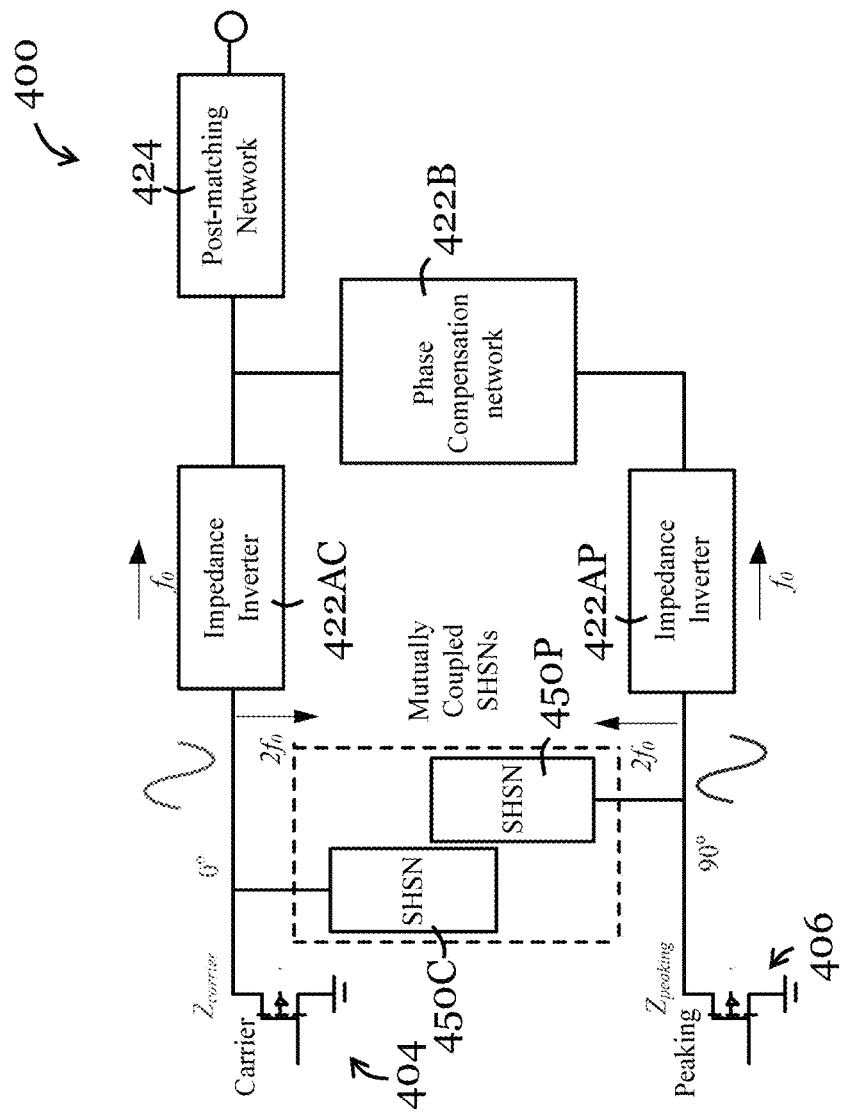
FIG. 4 is a block diagram showing an output arrangement of a Doherty power amplifier in accordance with one embodiment of the present invention.

FIG. 4 shows an output arrangement 400 of a Doherty power amplifier in accordance with one embodiment of the present invention. The arrangement 400 in FIG. 4 is different from FIG. 3 in that it further includes two second harmonic short-circuited networks SHSN 450C, 450P that are mutually coupled with each other. The harmonic short-circuited network 450C is connected at the output of the carrier device 404 and the harmonic short-circuited network 450P is connected at the output of the peaking device 406. The mutual coupling is preferably across the two branches and upstream of the impedance inverters 422AC, 422AP.

Figures 5A, 5B:
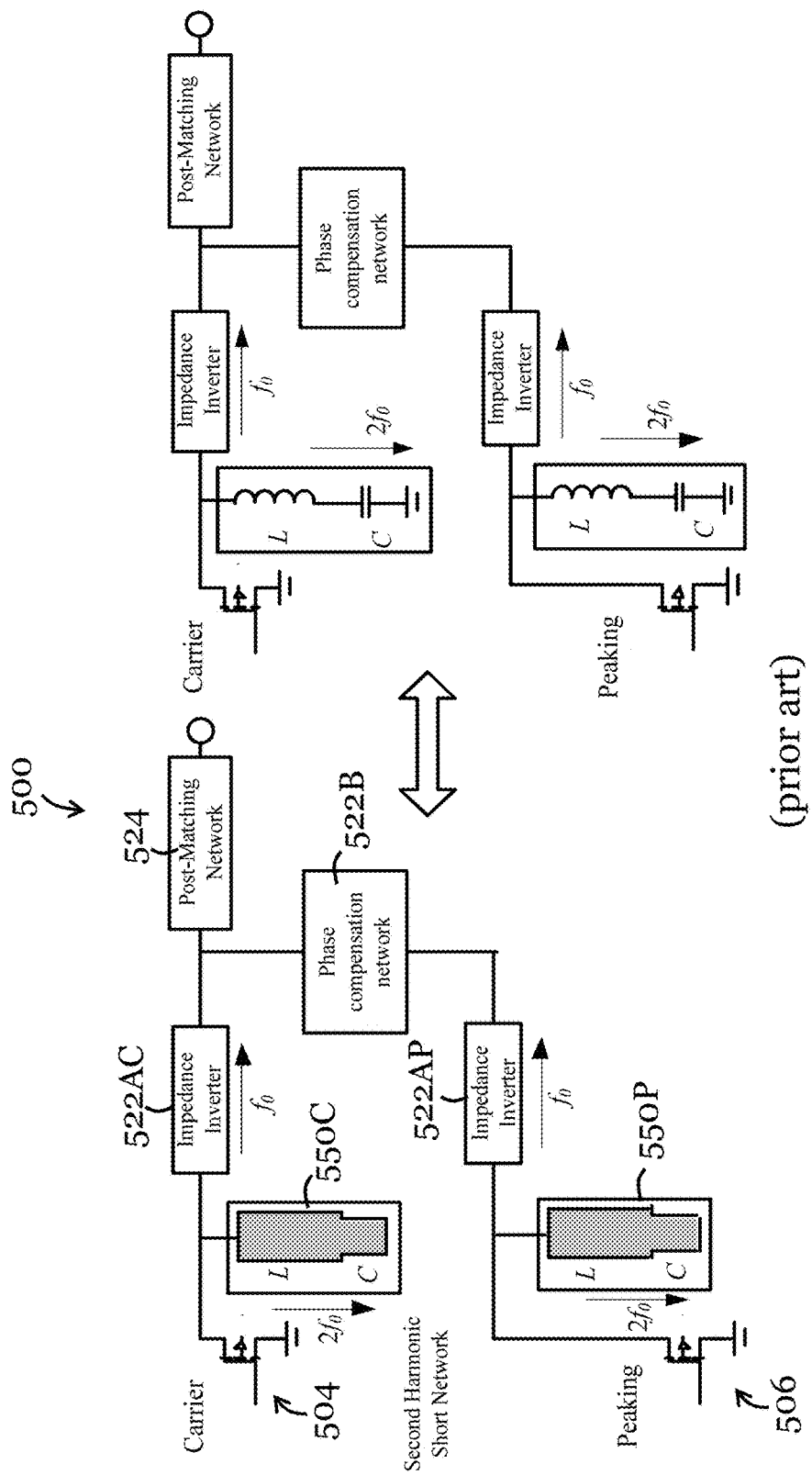

FIGS. 5a and 5b show an output arrangement 500 of a Doherty power amplifier. The arrangement 500 in these Figures is different from the arrangement 300 in FIG. 3 in that a transmission line, a second harmonic short-circuited network 550C, is arranged in parallel with the carrier device 504 and its impedance inverter 522AC, and another second harmonic short-circuited network 550P is arranged in parallel with the peaking device 506 and its impedance inverter 522AP. In this arrangement, the two second harmonic short-circuited networks 550C, 550P are not coupled with each other. The introduction of these two un-coupled second harmonic short-circuited networks 550C, 550P increases the efficiency of the power amplifier. In this embodiment, each of the second harmonic short-circuited networks 550C, 550P is an open-circuit stepped impedance transmission line.

The inventors of the present invention have devised, through research, experiments and trials, that the arrangement 500 shown in FIGS. 5a and 5b, while may improve efficiency of the power amplifier, leads to several limitations. Firstly, the operating bandwidth of the Doherty power amplifier is reduced due to the mismatch introduced by the second harmonic short-circuited networks 550C, 550P. Secondly, the fixed value of inductor (L) and capacitor (C) of second harmonic short-circuited networks 550C, 550P cannot realize the second harmonic short circuit over the entire output power range covering both the low power region and the Doherty region.

Figures 6A, 6B:
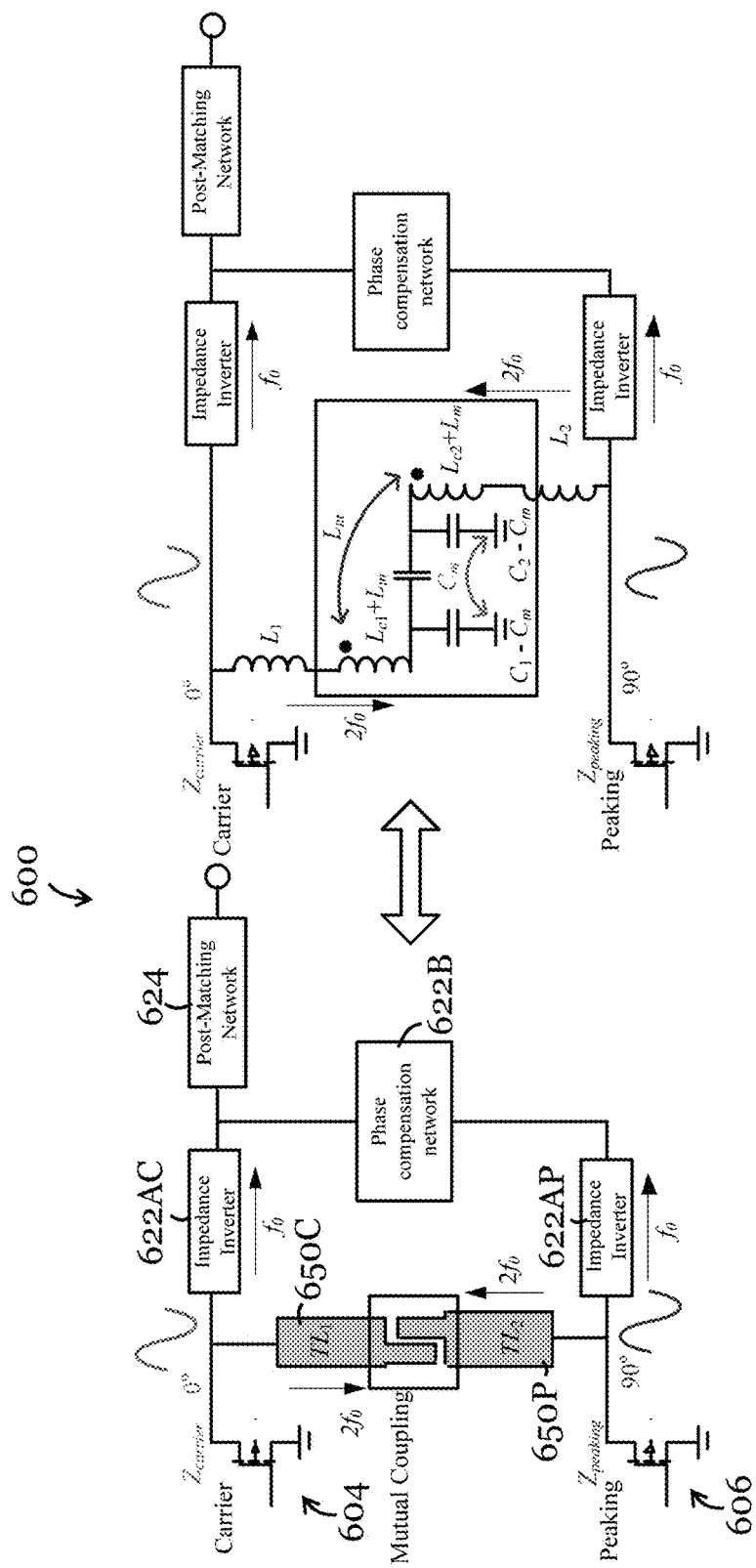

FIGS. 6a and 6b show an output arrangement 600 of a Doherty power amplifier in accordance with one embodiment of the present invention. The arrangement 600 in these Figures is different from the arrangement 500 in FIGS. 5a and 5b in that the second harmonic short-circuited networks 650C, 650P are arranged directly adjacent each other, so as to form a mutual coupling. The second harmonic short-circuited networks 650C, 650P are preferably open-circuited transmission lines. The mutual coupling includes a mutual electric coupling (corresponding $C_m$) that allows the external quality-factors ($Q_E$) of the single stepped impedance open-circuited transmission line to be decreased, which leads to a wider bandwidth for the short-circuited configuration. Preferably, the mutual coupling also includes a mutual magnetic coupling (corresponding $L_m$) at the low power region (and disappears at the Doherty region because of the quadrature phase between the two time-domain signal paths). Consequently, the equivalent inductor (L) of the mutual-coupling of the two second harmonic short-circuited networks changes with increasing output power, making the second harmonic short-circuited LC resonance circuit suitable for both the low power region and the Doherty region.

Figure 7:
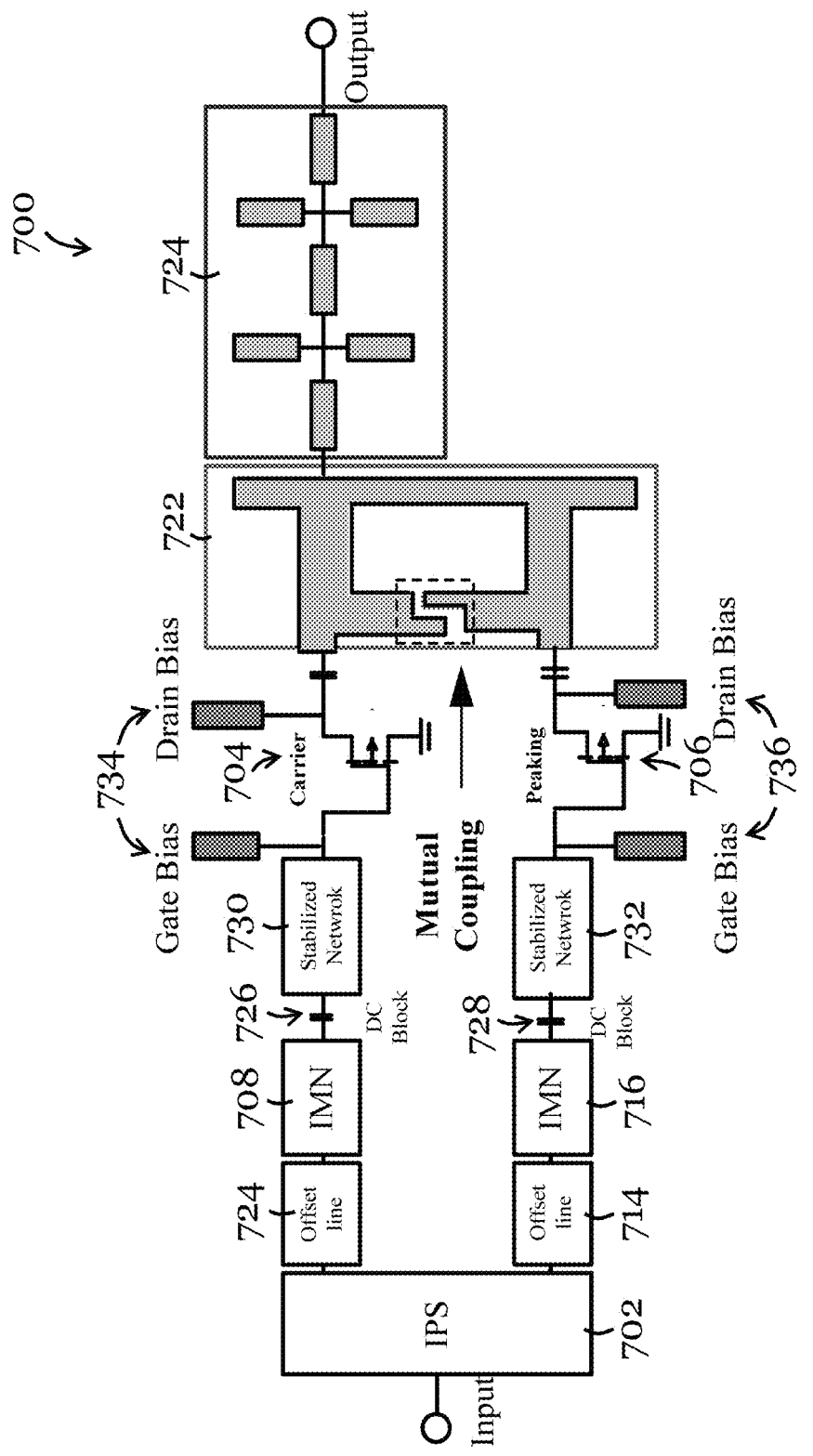
FIG. 7 is a block diagram illustrating a Doherty power amplifier in accordance with one embodiment of the present invention.

FIG. 7 is a block diagram illustrating a Doherty power amplifier 700 in accordance with one embodiment of the present invention. The amplifier 700 has a post-matching Doherty topology with a mutual coupling between the second harmonic short-circuited networks.

In the present embodiment, the Doherty power amplifier 700 includes a carrier (main) device 704 in a carrier amplifier circuit branch and a peaking (auxiliary) device 706 in a peaking amplifier circuit branch arranged in parallel with the carrier amplifier circuit branch. A load modulation network 722 is arranged to connect the output of the carrier device 704 and the output of the peaking device 706. The structure of the load modulation network 722 is similar to that illustrate in FIG. 6a, and it includes a first open-circuited transmission line arranged in parallel with an output of the carrier device 704 and a second open-circuited transmission line arranged in parallel with an output of the peaking amplifier 706. The first and second open-circuited transmission lines are arranged directly adjacent one another so as to form a mutual coupling. Preferably, the first and second open-circuited transmission lines form a pair of mutually coupled second harmonic short-circuited networks. In the present embodiment, as described with respect to FIGS. 6a and 6b, the mutual coupling is preferably an electric coupling. The mutual coupling may further be a magnetic coupling when the Doherty power amplifier 700 is operating in low power region.

In the embodiment shown in FIGS. 6 (and 7), the first open-circuited transmission line is stepped with a first portion and a second portion arranged at an open end. The second portion is preferably narrower than the first portion. A central axis of the second portion may be offset from a central axis of the first portion. The second open-circuited transmission line has a shape and form complementary to that of the first open-circuited transmission line. In this example, the second portion of the first open-circuited transmission line and the second portion of the second open-circuited transmission line are arranged directly adjacent each other.

A person skilled in the art would appreciate that the open-circuited transmission lines in the power amplifier in FIGS. 6 and 7 are not limited to the shape and form as shown, so long as a mutual coupling as described above can be formed therebetween during operation.

The load modulation network 722 also includes, like in FIG. 6a, an impedance transformation and phase compensation network connected with the output of the carrier device 704 and the output of the peaking device 706 for providing a combined output power. Preferably, the impedance transformation and phase compensation network comprises an impedance inverter connected at the output of the carrier device 704, an impedance inverter connected at the output of the peaking device 706, and a phase compensation network connected across the two impedance inverters to provide a combined output power. A post-matching network 724 may be connected with the load modulation network 722 to transfer the maximum power from the combined node to system load impedance. Preferably, the post-matching network 724 is a low pass matching network or a high order low-pass post-matching network.

The Doherty power amplifier 700 in FIG. 7 also includes a splitter circuit 702 arranged to receive an RF signal and split the RF signal into at least a signal to be transmitted to the carrier device 704 and a signal to be transmitted to the peaking power device 706. The splitter circuit 702 may comprise an input power splitter. Connected between the splitter circuit 702 and the carrier device 704, in the carrier amplifier circuit branch, are preferably an offset line 724, an input matching network 708, a DC block 726, and a stabilization network 730. A bias network 734 is preferably coupled with the carrier device 704 to bias the drain and gate of the carrier device 704. Similarly, connected between the splitter circuit 702 and the peaking device 706, in the peaking amplifier circuit branch, are preferably an offset line 714, an input matching network 716, a DC block 728, and a stabilization network 732. A bias network 736 is preferably arranged to bias the drain and gate of the peaking device 706.

In the embodiment of FIG. 7, the carrier device 704 is biased to operate in Class-AB mode. Also, in the embodiment of FIG. 7, the peaking device 706 is biased to operate in Class-C mode. Although the amplifier 700 illustrated in FIG. 7 only contains one peaking amplifier circuit and one carrier amplifier circuit, in alternative constructions, the Doherty power amplifier 700 may include further amplifier devices each arranged in a respective amplifier circuit, connected between the input and the output.

Figure 8B:
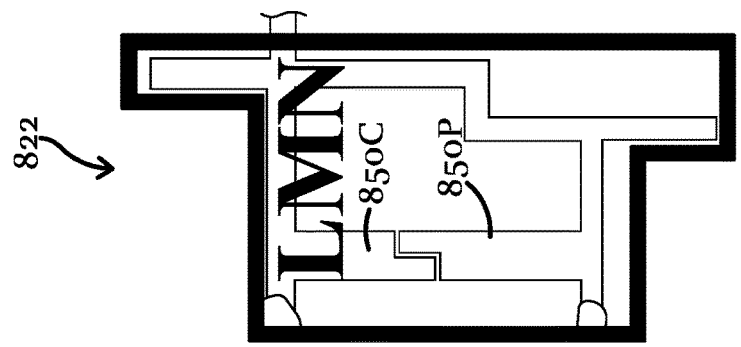
Figure 8A:
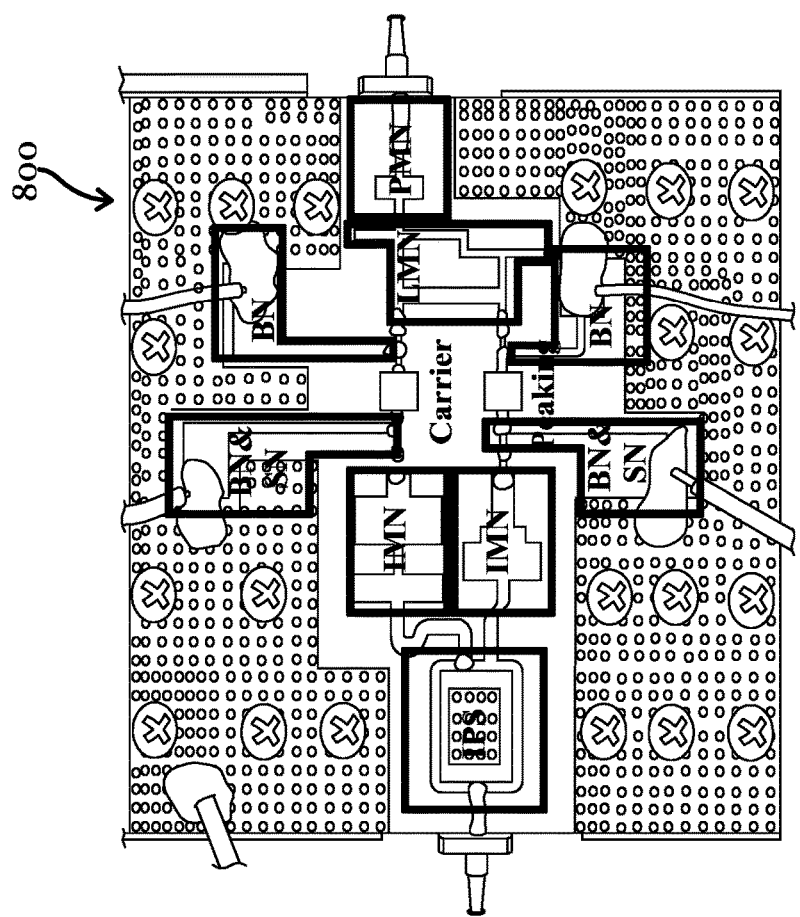
FIG. 8a is a picture of a Doherty power amplifier made based on FIG. 7.

FIG. 8a shows a Doherty power amplifier 800 fabricated based on the structure in FIG. 7. In this example, the Doherty power amplifier with broad bandwidth and enhanced efficiency was designed using Rogers substrate 4003C ($\varepsilon_r$=3.38, h=0.813 mm) and fabricated based on commercially available gallium nitride HEMT (Cree CGH 40006P) devices. FIG. 8b is an enlarged view of the load modulation network 822 in FIG. 8a, and it shows the specific arrangement of the two open-circuited transmission lines 850C. 850P.

Experiments were performed to verify the performance of the Doherty power amplifier 800 in FIG. 8a. In the experiments, small signal performance was measured using an Agilent ENA Series Network Analyser E5071C, while the drain efficiencies, gains and adjacent channel power ratios (ACPRs) were measured using a Agilent CXA Signal Analyzer N9000A.

Figure 9:
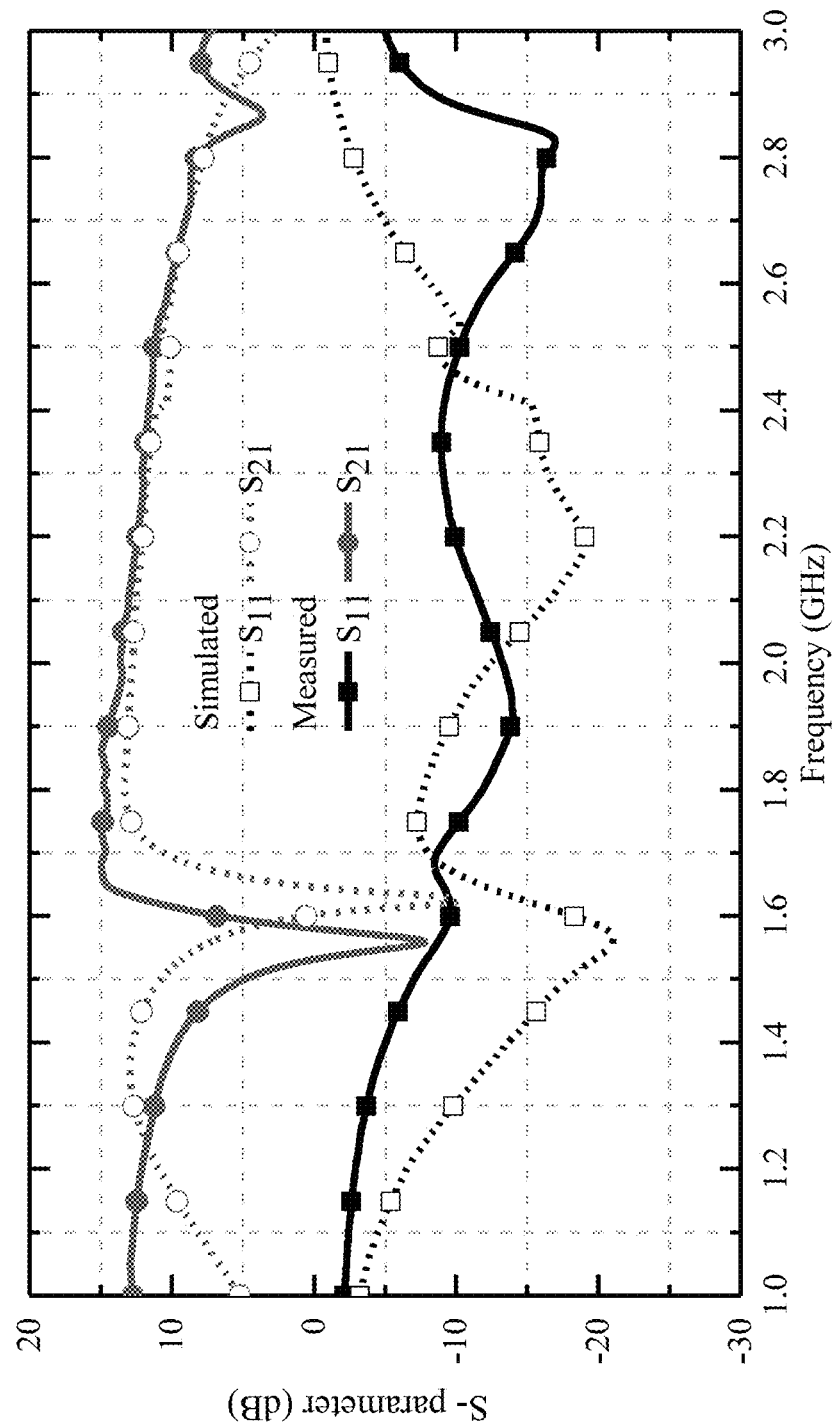

FIG. 9 shows the measured and simulated small signal performances. The broadband amplifier 800 of FIG. 8a was measured under their nominal bias points, namely, ($I_{DS,C}$=43 mA, $V_{GS,P}$=−5.85V, and $V_{DS,C}$=$V_{DS,P}$=28V).

Figure 10:
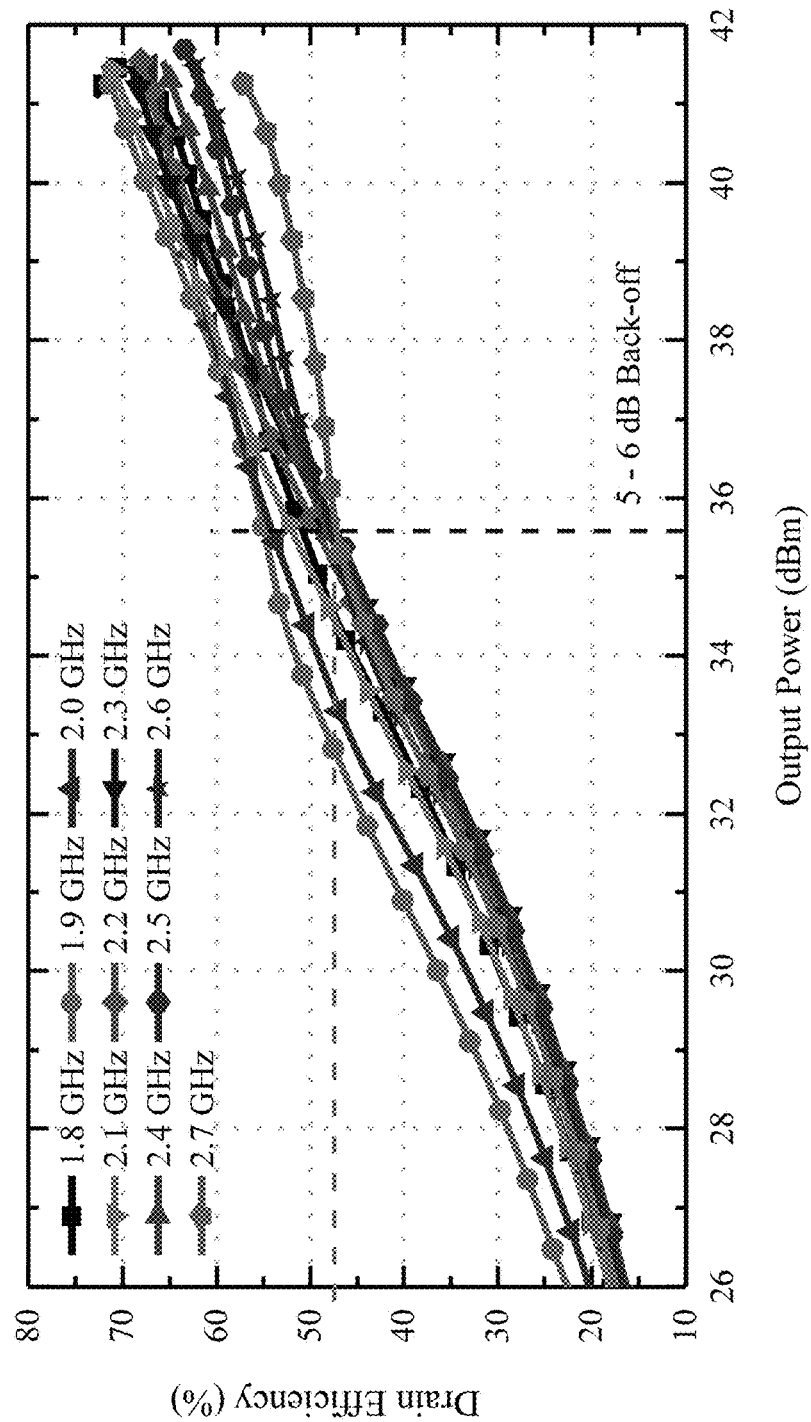
FIG. 10 is a graph showing measured drain efficiency of the Doherty power amplifier of FIG. 8a for different output power at different frequencies.

FIG. 10 shows the measured drain efficiencies of amplifier 800 of FIG. 8a versus the output power level for the whole operating frequency range. For the amplifier 800 of FIG. 8a, wideband Doherty behavior can be observed from 1.8 GHz to 2.7 GHz, which corresponds to a bandwidth of 40%. Over this same frequency band, the drain efficiencies are 47.5%-54% and 57%-73% for the 5-6 dB output power back-off (OBO) and saturation regions, respectively.

Figure 11:
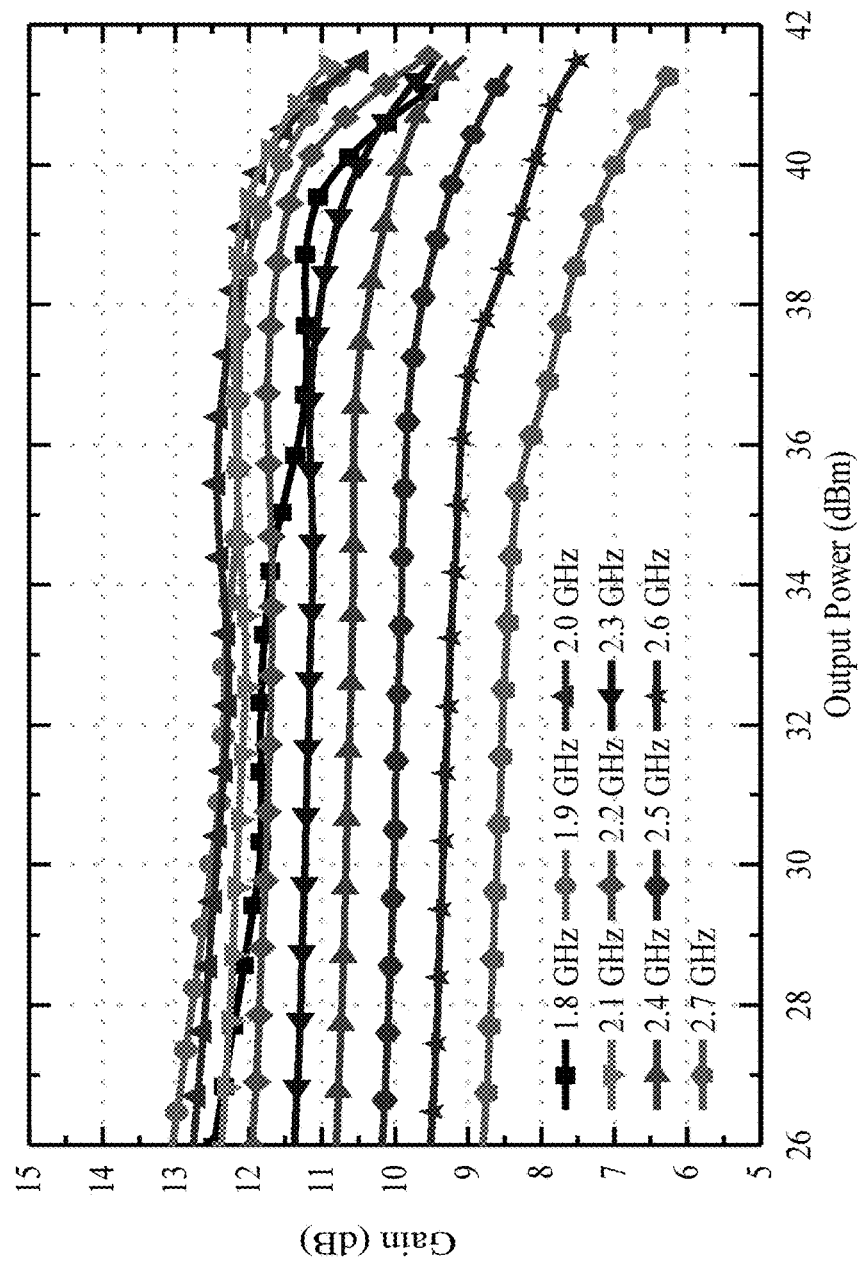
FIG. 11 is a graph showing measure gains of the Doherty power amplifier of FIG. 8a for different output power at different frequencies.

FIG. 11 shows the measured gains of the amplifier 800 of FIG. 8a versus output power level for the whole operating frequency range. For the amplifier 800 of FIG. 8a, the gain decreases from 13.0 dB to 8.8 dB with varying output power and the compression point at saturation is less than 3 dB within the operating frequency band.

Figure 12:
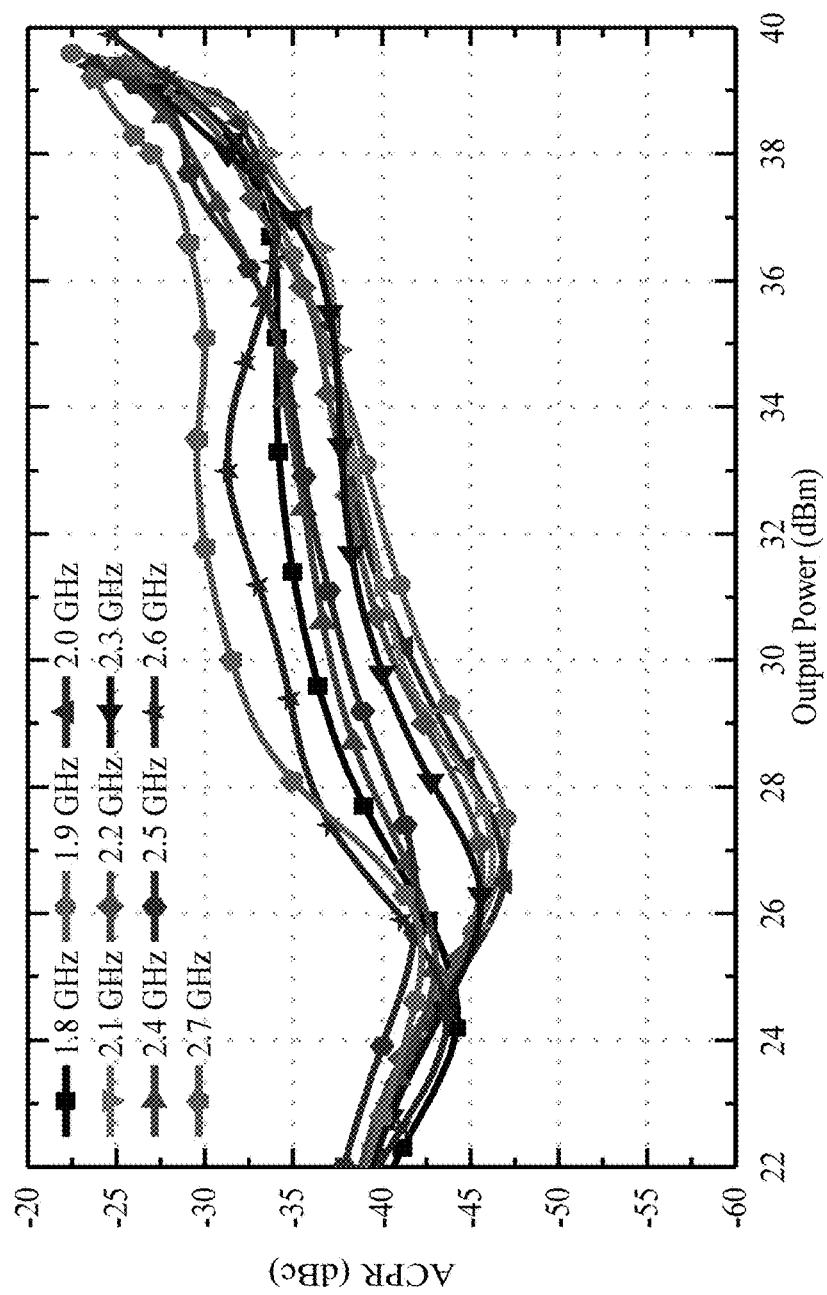
FIG. 12 is a graph showing measured adjacent channel power ratios of the Doherty power amplifier of FIG. 8a for different output power at different frequencies.

FIG. 12 shows measured adjacent channel power ratios (ACPRs) of the amplifier 800 of FIG. 8a under modulated signal excitation. The modulated signal adopts a single carrier WCDMA 3GPP test signal with PAPR of 6.5 dB at 0.1% probability of complementary cumulative distribution function (CCDF). As the ACPRs in both upper and lower bands are similar, only one of them is shown. ACPR performance of the proposed amplifier 800 was better than −23 dBc at saturation and −30 dBc at back-off from 1.8 to 2.7 GHz.

In the above embodiments of the present invention, by placing the two short-circuited transmission lines close together, a mutual coupling between them is produced. This mutual coupling can be separated into electric coupling ($C_m$) and magnetic coupling ($L_m$). In particular, the electric coupling ($C_m$) introduced between the two second harmonic short-circuited networks decreases the quality factor ($Q_E$), providing a second harmonic short circuit over a wide frequency range. The magnetic coupling (Lm) introduced between the two second harmonic short-circuited networks disappears when the peaking device is conducting. This leads to a decrease of equivalent inductance. Consequently, each second harmonic short-circuited network achieves a second harmonic short circuit at both back-off and saturation.

The Doherty power amplifier in the above embodiments of the present invention provides enhanced efficiency and further reduces power consumption. This is particularly important for battery-powered electronic devices in which power consumption determines usage time. Also, the Doherty power amplifiers in the above embodiments of the present invention can be applied to various kinds of electronic devices, such as mobile handsets and base stations. In one example, the power amplifiers in the base station of 3G wireless communication systems adopt the modulated signal with 6.5 dB PAPR, and the Doherty power amplifier in the above embodiments can provide higher efficiency from back-off point (6 dB) to saturation while maintaining a broad bandwidth.

The Doherty power amplifier in the above embodiments of the present invention provides various advantages. Firstly, it has a broad bandwidth, which can cover multiple-bands of wireless communication system. Second, due to the presence of mutual coupling between two second harmonic short-circuited networks/components, a higher efficiency can be obtained over a broad bandwidth. The approach to achieve this efficiency improvement over the broad bandwidth is simple and design-friendly, i.e., mainly by adjusting the distance between two second harmonic short-circuited networks/components, without requiring extra components or complex circuitry. The proposed technique is also suitable for high power applications (such as 100 watts), and so is also adapted for industrial applications.

It will be appreciated by persons skilled in the art that numerous variations and/or modifications may be made to the invention as shown in the specific embodiments without departing from the spirit or scope of the invention as broadly described. For example, the use of two power transistors can be of any type and for different power applications. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A Doherty power amplifier, comprising:
   a main device in a main amplifier circuit;
   an auxiliary device in an auxiliary amplifier circuit arranged in parallel with the main amplifier circuit;
   a load modulation network, comprising:
     a first open-circuited transmission line connected with an output of the main device;
     a second open-circuited transmission line connected with an output of the auxiliary device; and
     an impedance transformation and phase compensation network connected with the output of the main device and the output of the auxiliary device for providing a combined output power;
   wherein the first and second open-circuited transmission lines are arranged directly adjacent one another to form, during operation, a mutual coupling therebetween.

2. The Doherty power amplifier of claim 1, wherein the mutual coupling comprises an electric coupling.

3. The Doherty power amplifier of claim 2, wherein the mutual coupling further comprises a magnetic coupling when the Doherty power amplifier is operating in low power region.

4. The Doherty power amplifier of claim 1, wherein the first and second open-circuited transmission lines each forms a respective second harmonic short-circuited network; the two second harmonic short-circuited networks being mutually coupled during operation.

5. The Doherty power amplifier of claim 1, wherein the first open-circuited transmission line is stepped with a first portion and a second portion narrower than the first portion.

6. The Doherty power amplifier of claim 5, wherein a central axis of the second portion is offset from a central axis of the first portion.

7. The Doherty power amplifier of claim 5, wherein the second portion is arranged at an open end.

8. The Doherty power amplifier of claim 1, wherein the second open-circuited transmission line is stepped with a first portion and a second portion narrower than the first portion.

9. The Doherty power amplifier of claim 8, wherein a central axis of the second portion is offset from a central axis of the first portion.

10. The Doherty power amplifier of claim 8, wherein the second portion is arranged at an open end.

11. The Doherty power amplifier of claim 1, wherein the first and second open-circuited transmission lines have complementary shapes.

12. The Doherty power amplifier of claim 1, wherein:
   the first open-circuited transmission line is stepped with a first portion and a second portion narrower than the first portion;
   the second open-circuited transmission line is stepped with a first portion and a second portion narrower than the first portion; and
   wherein at least the second portion of the first open-circuited transmission line and the second portion of the second open-circuited transmission line are arranged directly adjacent each other.

13. The Doherty power amplifier of claim 1, wherein the impedance transformation and phase compensation network comprises:
- a first impedance inverter connected at the output of the main device;
- a second impedance inverter connected at the output of the auxiliary device; and
- a phase compensation network connected across the first and second impedance inverters to provide the combined output.

14. The Doherty power amplifier of claim 1, further comprising a splitter circuit arranged to receive an RF signal and split the RF signal into at least
- a signal to be transmitted to the main amplifier circuit; and
- a signal to be transmitted to the auxiliary amplifier circuit.

15. The Doherty power amplifier of claim 1, wherein the main amplifier circuit further includes:
- an input matching network;
- a stabilization network; and
- a bias network arranged to bias one or both of drain and gate of the main device.

16. The Doherty power amplifier of claim 1, wherein the auxiliary amplifier circuit further includes:
- an input matching network;
- a stabilization network; and
- a bias network arranged to bias one or both of drain and gate of the auxiliary device.

17. The Doherty power amplifier of claim 1, further comprising a post-matching network connected with the load modulation network to regulate the combined output power.

18. The Doherty power amplifier of claim 17, wherein the post-matching network is a high-order low pass matching network.

19. The Doherty power amplifier of claim 1, wherein the main device is a carrier device biased to operate in Class-AB mode.

20. The Doherty power amplifier of claim 1, wherein the auxiliary device is a peaking device biased to operate in Class-C mode.

* * * * *